United States Patent
Chang et al.

(10) Patent No.: US 10,615,183 B2
(45) Date of Patent: Apr. 7, 2020

(54) ELECTRONIC DEVICE

(71) Applicant: HANNSTAR DISPLAY CORPORATION, Taipei (TW)

(72) Inventors: Chung-Lin Chang, Kaohsiung (TW); Hsuan-Chen Liu, Kaohsiung (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 16/198,718

(22) Filed: Nov. 21, 2018

(65) Prior Publication Data
US 2019/0189637 A1    Jun. 20, 2019

(30) Foreign Application Priority Data
Dec. 18, 2017    (CN) .......................... 2017 1 1364874

(51) Int. Cl.
*H01L 23/552* (2006.01)
*H01L 27/12* (2006.01)
*H01L 23/544* (2006.01)
*H01L 25/18* (2006.01)
*H01L 23/10* (2006.01)
*G02F 1/1362* (2006.01)

(52) U.S. Cl.
CPC ............ *H01L 27/124* (2013.01); *H01L 23/10* (2013.01); *H01L 23/544* (2013.01); *H01L 23/552* (2013.01); *H01L 25/18* (2013.01); *G02F 1/136209* (2013.01); *H01L 2223/5442* (2013.01); *H01L 2223/54426* (2013.01); *H01L 2223/54486* (2013.01); *H01L 2223/54493* (2013.01)

(58) Field of Classification Search
CPC ... H01L 24/32; H01L 23/5226; H01L 23/585; H01L 23/5227; H01L 23/544; H01L 24/83; H01L 2224/1147; H01L 23/49562; H01L 23/522; H01L 24/33; H01L 25/03; H01L 27/0688
USPC .......................................................... 257/659
See application file for complete search history.

(56) References Cited

U.S. PATENT DOCUMENTS

| | | | | |
|---|---|---|---|---|
| 2003/0199131 A1* | 10/2003 | Fujimoto | .............. | G03F 9/7076 438/200 |
| 2005/0051909 A1* | 3/2005 | Inomata | ................ | H01L 23/544 257/797 |

* cited by examiner

*Primary Examiner* — Theresa T Doan
(74) *Attorney, Agent, or Firm* — Winston Hsu

(57) ABSTRACT

An electronic device includes a first substrate, a second substrate, a plurality of first metal line segments and a shielding layer. The second substrate is opposite to the first substrate. The first metal line segments are disposed on the first substrate and extend along a first direction, wherein at least one of the first metal line segments includes a first alignment part and a first trace part, a width of the first alignment part is larger than a width of the first trace part, and the first alignment parts are arranged along a second direction. The shielding layer is disposed on the second substrate, and the shielding layer includes a plurality of first alignment structures, wherein one of the first alignment parts is aligned with one of the first alignment structures in a normal vector of the first substrate.

20 Claims, 12 Drawing Sheets

ELECTRONIC DEVICE

CROSS REFERENCE TO RELATED APPLICATION

This application claims the priority benefit of China application serial No. 201711364874.5, filed Dec. 18, 2017. The entirety of the above-mentioned patent application is hereby incorporated by reference herein and made a part of this specification.

BACKGROUND OF THE INVENTION

1. Field of the Invention

The present invention relates to an electronic device, and more particularly to an electronic device having a narrow border.

2. Description of the Prior Art

Nowadays, electronic device has become an indispensable item in society. For example, since the electronic device such as the display device or the touch display device has the characteristics of thin appearance, light weight, low power consumption and no radiation pollution, it has been widely used in many kinds of portable or wearable electronic products, such as notebooks, smart phones, watches, and display devices in vehicles, for transmitting and displaying information more conveniently. In current assembly technology, a scale is disposed at the surrounding of two substrates of the electronic device for determining the assembly misalignment between two substrates. However, the disposition of the scale is adverse to shrink borders of the electronic device.

SUMMARY OF THE INVENTION

The present invention provides an electronic device, a metal wire in a peripheral region of the electronic device includes an alignment part having a larger width, and the present invention utilizes an alignment structure of the shielding layer and the alignment part of the metal wire as a scale for determining assembly misalignment between two substrate, such that the scale is combined with the metal wire in peripheral region to shrink borders of the electronic device.

An embodiment of the present invention provides an electronic device including a first substrate, a second substrate, a plurality of first metal line segments and a shielding layer. The second substrate is opposite to the first substrate. The first metal line segments are disposed on the first substrate, and the first metal line segments extend along a first direction, wherein at least one the first metal line segments includes a first alignment part and a first trace part, a width of the first alignment part is larger than a width of the first trace part, and the first alignment parts are arranged along a second direction different from the first direction. The shielding layer is disposed on the second substrate, and the shielding layer includes a plurality of first alignment structures, wherein one of the first alignment parts is aligned with one of the first alignment structures in a normal vector of the first substrate.

In the electronic device of the present invention, since the alignment parts configured to determine the assembly misalignment existing between the first substrate and the second substrate is integrated into the metal wires in the peripheral region, and the alignment part is a portion of the metal wire, it does not need to increase extra space for disposing the scale for alignment in the peripheral region. Therefore, as compared with a conventional electronic device, the area of the peripheral region may be reduced, which shrinks the borders of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
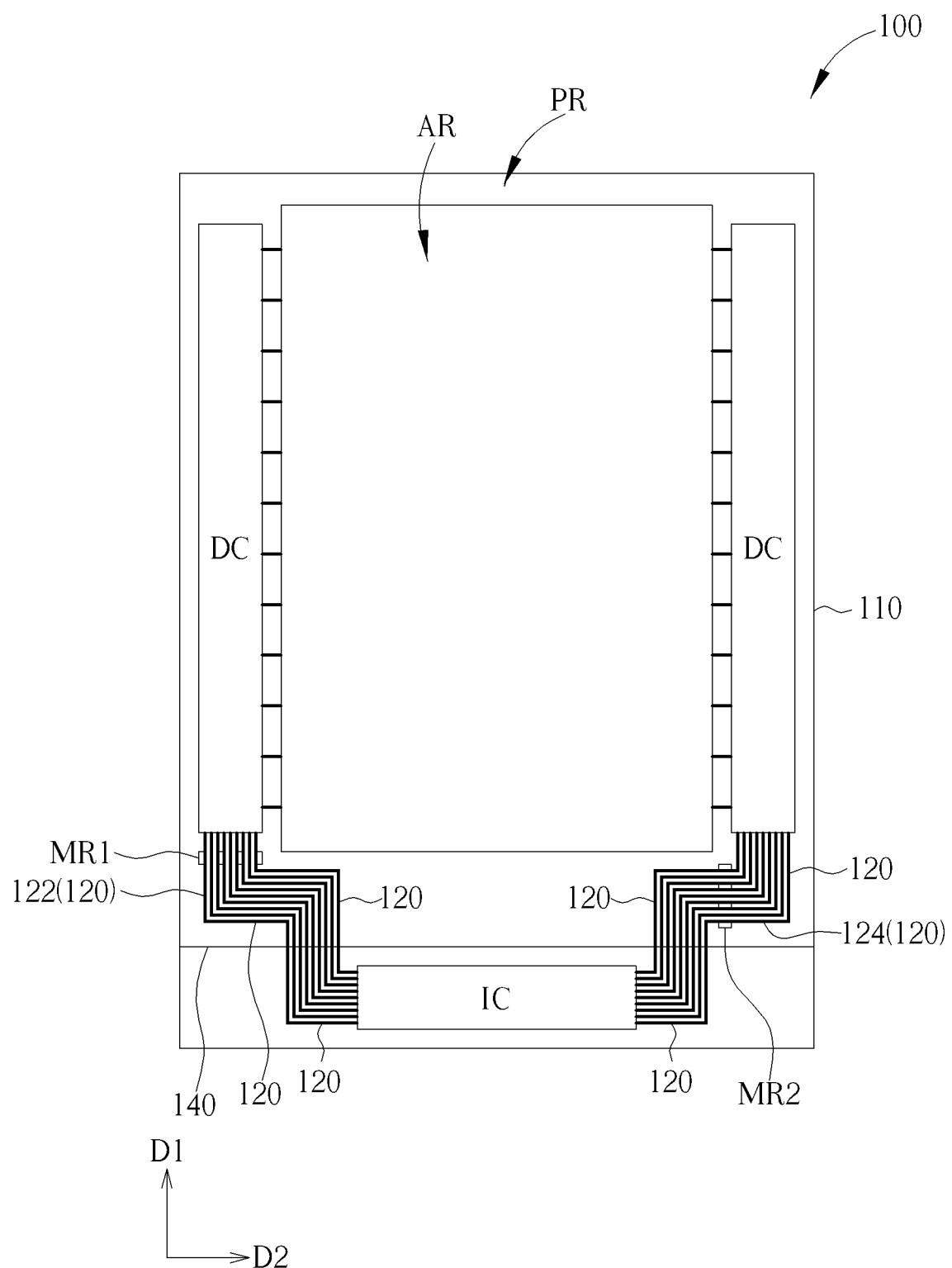
FIG. 1 is a top-view schematic diagram illustrating an electronic device of a first embodiment of the present invention.

To provide a better understanding of the present invention to those skilled in the art, preferred embodiments will be detailed in the follow description. The preferred embodiments of the present invention are illustrated in the accompanying drawings with numbered elements to elaborate on the contents and effects to be achieved. It should be noted that the drawings are simplified schematics, and therefore show only the components and combinations associated with the present invention, so as to provide a clearer description for the basic structure or implementing method of the present invention. The components would be more complex in reality. In addition, for ease of explanation, the components shown in the drawings may not represent their actual number, shape, and dimensions; details may be adjusted according to design requirements.

Figure 2:
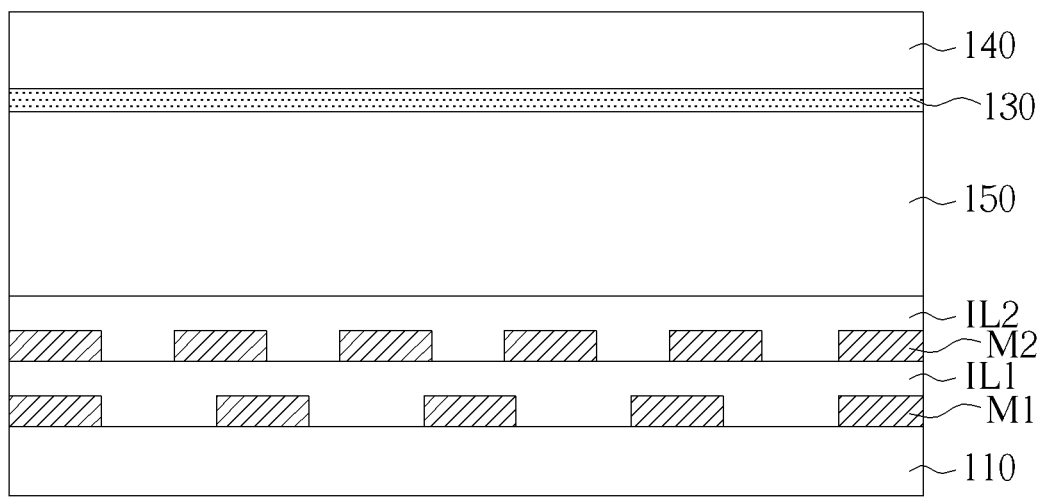
FIG. 2 is a cross-sectional view schematic diagram illustrating the electronic device of the first embodiment of the present invention.

Referring to FIG. 1 and FIG. 2, FIG. 1 is a top-view schematic diagram illustrating an electronic device of a first embodiment of the present invention, and FIG. 2 is a cross-sectional view schematic diagram illustrating the electronic device of the first embodiment of the present invention. As shown in FIG. 1 and FIG. 2, the electronic device 100 of this embodiment may be such as a display panel, a touch panel, a touch display panel, or other electronic devices which need to be assembled with two substrates, and the electronic device 100 in this description is the display panel for example. The electronic device 100 may have an active region AR and a peripheral region PR, and the peripheral region PR is situated outside the active region AR. For example, electronic components such as display components, thin film transistors (TFT), data lines or scan lines are disposed in the active region AR, and electronic components such as bonding pads, an integrated circuit IC disposed on the bonding pads or a driving circuit DC (such as integrated gate driver (IGD)) configured to drive the electronic components in the active region AR are disposed in the peripheral region PR. The electronic device 100 includes a first substrate 110, a second substrate 140, a plurality of metal wires 120 and a shielding layer 130. The second substrate 140 is opposite to the first substrate 110, and the aforementioned components in the active region AR and the peripheral region PR may be disposed on the first substrate 110 or the second substrate 140. The first substrate 110 and the second substrate 140 may be a rigid substrate such as a glass substrate, a plastic substrate, a quartz substrate or a sapphire substrate, or a flexible substrate including polyimide (PI) or polyethylene terephthalate (PET) for example, but the present invention is not limited thereto. Note that the second substrate 140 are perspectively shown in FIG. 1, so as to show the components situated between the first substrate 110 and the second substrate 140, wherein the components disposed in the active region AR are omitted in FIG. 1. Furthermore, a size of the second substrate 140 may be smaller than a size of the first substrate 110, but the present invention is not limited thereto. In another embodiment, the size of the second substrate 140 may be the same as the size of the first substrate 110.

The metal wires 120 are situated between the first substrate 110 and the second substrate 140, and are disposed on the first substrate 110 within the peripheral region PR; that is, the metal wires 120 are disposed on the first substrate 110 before assembling the first substrate 110 and the second substrate 140. The metal wires 120 of this embodiment may include a plurality of first metal line segments 122 extending along a first direction D1. Furthermore, the metal wires 120 may selectively include a plurality of second metal line segments 124 extending along a second direction D2, wherein the first direction D1 is different from (not parallel to) the second direction D2. In this embodiment, the first direction D1 is perpendicular to the second direction D2, but the present invention is not limited thereto. In this embodiment, each of the metal wires 120 includes one of the first metal line segments 122 or one of the second metal line segments 124; that is, the first metal line segments 122 and the second metal line segments 124 are included in different metal wires 120 respectively. As shown in FIG. 1, the first metal line segments 122 are adjacent to a side of the first substrate 110 and correspond to a corner of the second substrate 140 (that is a direction perpendicular to a surface of the first substrate 110), the second metal line segments 124 are adjacent to another side of the first substrate 110 and correspond to another corner of the second substrate 140 (that is different from the corner corresponding the first metal line segments 122), but the present invention is not limited thereto. Moreover, the first metal line segments 122 and the second metal line segments 124 may be formed of a metal layer disposed on the first substrate 110. In detail, the electronic device 100 of this embodiment may include a first metal layer M1 and a first insulating layer IL1, in which the first metal layer M1 is disposed on the first substrate 110, and the first insulating layer IL1 is disposed on the first metal layer M1. Furthermore, the electronic device 100 may selectively include a second metal layer M2 and a second insulating layer IL2, and the electronic device 100 may further include other conductive films and/or other insulating films, wherein the second metal layer M2 is disposed on the first insulating layer IL1, and the second insulating layer IL2 is disposed on the second metal layer M2. The metal wires 120 may be formed of the first metal layer M1 and/or the second metal layer M2. For instance, the first metal line segments 122 and the second metal line segments 124 included in the metal wires 120 may be formed of the first metal layer M1, may be formed of the second metal layer M2, or may be respectively formed of the first metal layer M1 and the second metal layer M2, but the present invention is not limited thereto. Note that a portion of the electronic components within the active region AR and a portion of the electronic components in the peripheral region PR of this embodiment may be formed of the first metal layer M1, the first insulating layer IL1, the second metal layer M2 and the second insulating layer IL2. For example, with regards to the thin film transistor within the active region AR, a gate electrode may be formed of the first metal layer M1, and a source electrode and a drain electrode may be formed of the second metal layer M2, so as to form a bottom gate transistor; furthermore, the driving circuit DC within the peripheral region PR may be formed of the aforementioned layers, but the present invention is not limited thereto. In addition, the metal wires 120 of this embodiment may be electrically connected to at least one circuit; that is to say, the first metal line segments 122 and the second metal line segments 124 may be electrically connected to at least one circuit, e.g. at least one of the metal wires 120 may electrically connected to a common electrode, the driving circuit, an electrostatic discharge circuit, the bonding pad or the integrated circuit. In FIG. 1, the metal wires 120 are electrically connected to the integrated circuit IC and the driving circuit DC, but the present invention is not limited thereto.

Figure 3A:
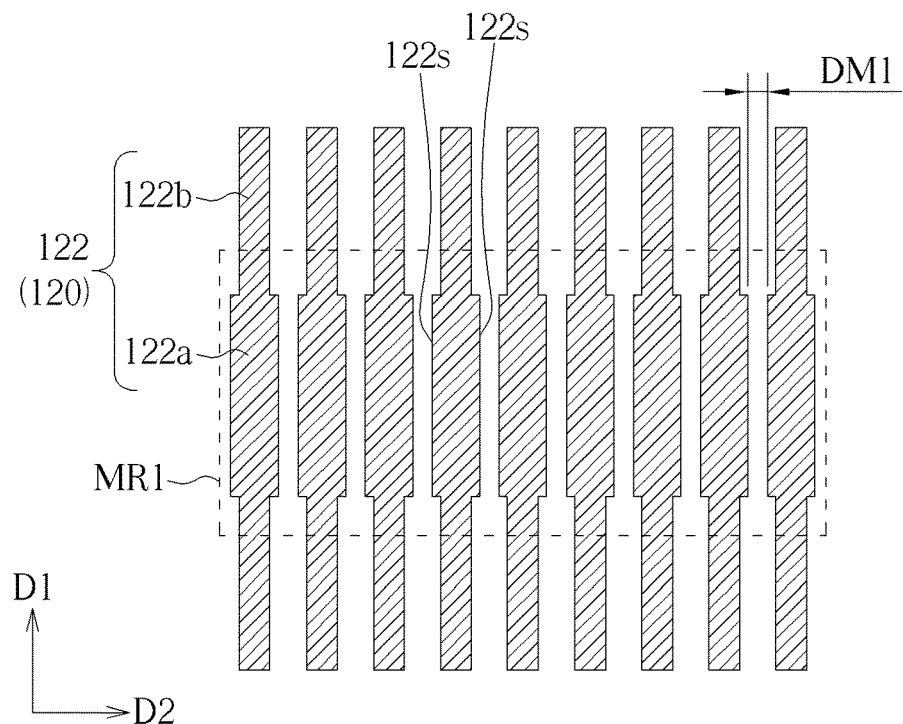
FIG. 3A is a top-view schematic diagram illustrating the first metal line segments of the first embodiment of the present invention.
Figure 3B:
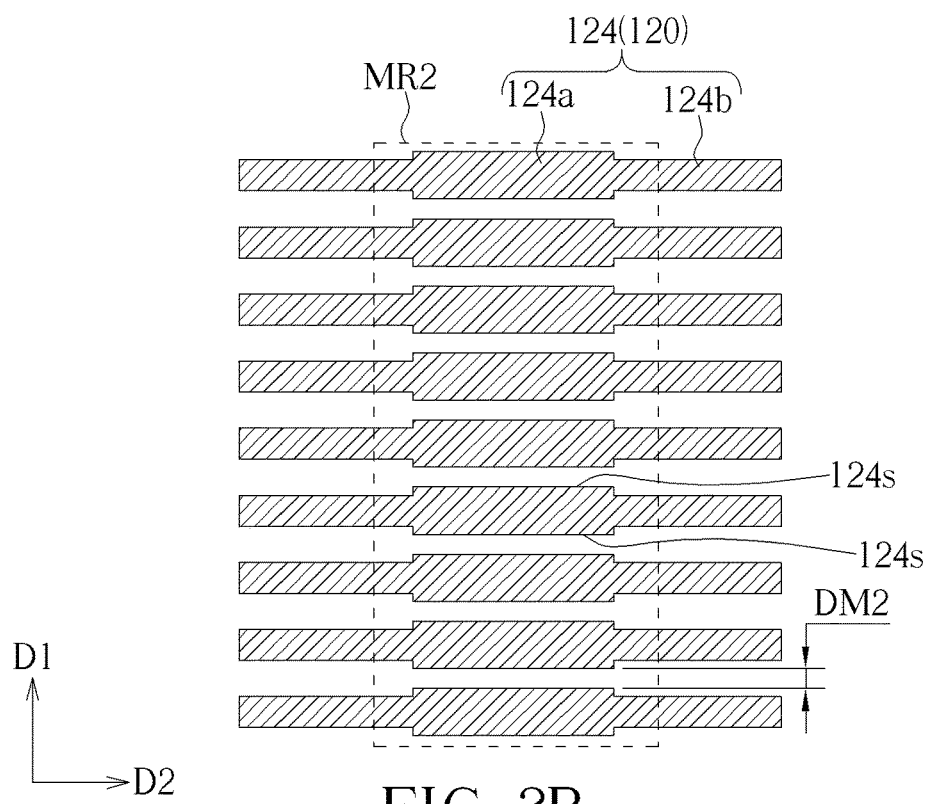
FIG. 3B is a top-view schematic diagram illustrating the second metal line segments of the first embodiment of the present invention.

Referring to FIG. 3A and FIG. 3B, and further referring to FIG. 1 at the same time, FIG. 3A is a top-view schematic diagram illustrating the first metal line segments of the first embodiment of the present invention, and FIG. 3B is a top-view schematic diagram illustrating the second metal line segments of the first embodiment of the present invention. As shown in FIG. 1, FIG. 3A and FIG. 3B, a first mark region MR1 may be included in the peripheral region PR of the electronic device 100, and at least a portion of the first metal line segments 122 is situated within the first mark region MR1, in which at least one of the first metal line segments 122 includes a first alignment part 122a and a first trace part 122b, a width of the first alignment part 122a is larger than a width of the first trace part 122b, and the first alignment parts 122a are arranged along the second direction D2 and located within the first mark region MR1. The extending direction of the first metal line segments 122 is different from the arranging direction of the first alignment parts 122a. Similarly, a second mark region MR2 may be further disposed in the peripheral region PR of the electronic device 100, and at least a portion of the second metal line segments 124 is situated within the second mark region MR2, in which at least one of the second metal line segments 124 includes a second alignment part 124a and a second trace part 124b, a width of the second alignment part 124a is larger than a width of the second trace part 124b, and the second alignment parts 124a are arranged along the first direction D1 and located within the second mark region MR2. In order to explain easily, a shape of at least one of the first alignment parts 122a and a shape of at least one of the second alignment parts 124a of this embodiment are rectangular, in which two sides of at least one of the first alignment parts 122a parallel to the first direction D1 are defined as first sides 122s, and two sides of at least one of the second alignment parts 124a parallel to the second direction D2 are defined as second sides 124s, but the present invention is not limited thereto. In another embodiment, the alignment part may be designed as other suitable shape, and the first sides 122s and the second sides 124s may be curved sides. In this embodiment, since the first metal line segments 122 and the second metal line segments 124 may be adjacent to different sides of the first substrate 110, and may correspond different corners of the second substrate 140, the first alignment parts 122a and the second alignment parts 124a may be adjacent to different sides of the first substrate 110 (or the second substrate 140), and may correspond different corners of the second substrate 140 (i.e. the first alignment parts 122a correspond to a corner of the second substrate 140, and the second alignment parts 124a correspond to another corner of the second substrate 140), but the present invention is not limited thereto. On the other hand, because an interval exists between two adjacent metal wires for separating two adjacent metal wires, a first metal interval DM1 exists between two adjacent first alignment parts 122a, and a second metal interval DM2 exists between two adjacent second alignment parts 124a. The first metal intervals DM1 and the second metal intervals DM2 of this embodiment may be the same as each other, but the present invention is not limited thereto. In another embodiment, at least two of the first metal intervals DM1 may be different, at least two of the second metal intervals DM2 may be different, and the first metal intervals DM1 may be different from the second metal intervals DM2. Moreover, in this embodiment, the first metal intervals DM1 and the second metal intervals DM2 may be larger than or equal to about 2 μm; that is, a distance between two adjacent first alignment parts 122a and a distance between two adjacent second alignment parts 124a may be larger than or equal to about 2 μm, but the present invention is not limited thereto.

Figure 4A:
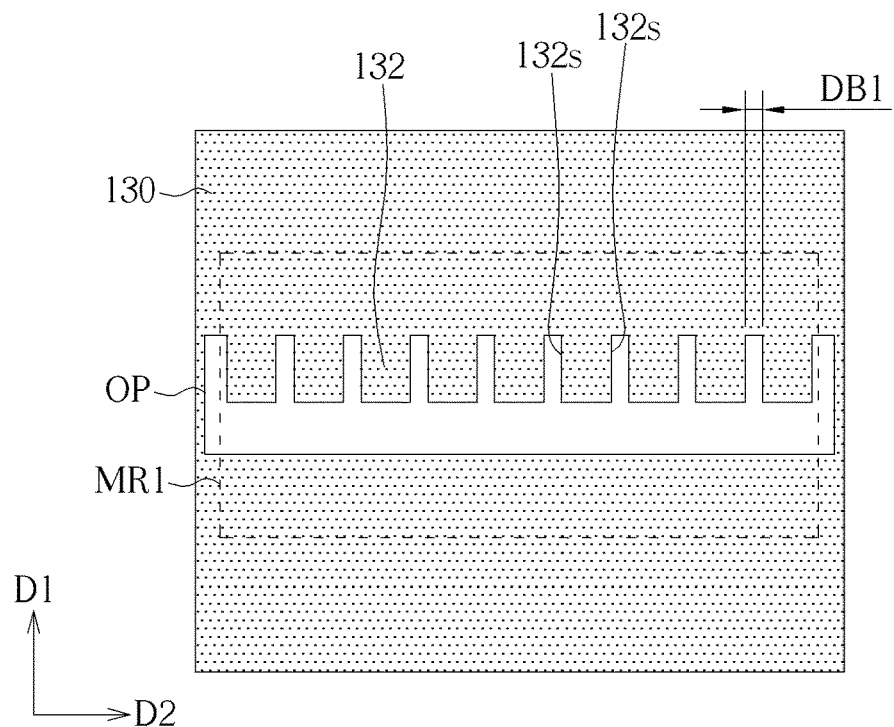
FIG. 4A is a top-view schematic diagram illustrating the first alignment structures of the shielding layer of the first embodiment of the present invention.
Figure 4B:
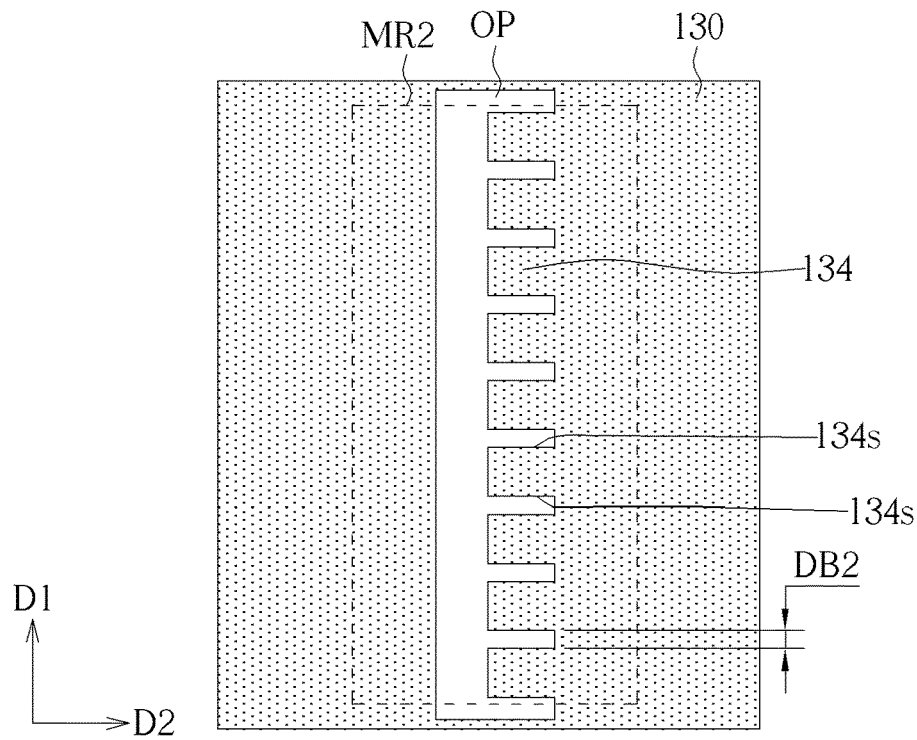
FIG. 4B is a top-view schematic diagram illustrating the second alignment structures of the shielding layer of the first embodiment of the present invention.

Referring to FIG. 4A and FIG. 4B, and further referring to FIG. 1 and FIG. 2 at the same time, FIG. 4A is a top-view schematic diagram illustrating the first alignment structures of the shielding layer of the first embodiment of the present invention, and FIG. 4B is a top-view schematic diagram illustrating the second alignment structures of the shielding layer of the first embodiment of the present invention. As shown in FIG. 1, FIG. 2, FIG. 4A and FIG. 4B, the shielding layer 130 is situated between the first substrate 110 and the second substrate 140, and is disposed on the second substrate 140; that is, the shielding layer 130 is disposed on the second substrate 140 before assembling the first substrate 110 and the second substrate 140. In the first mark region MR1 of the peripheral region PR, the shielding layer 130 includes a plurality of first alignment structures 132 (as shown in FIG. 4A), in which each of the first alignment structures 132 may respectively overlap at least a portion of one of the first alignment parts 122a in the normal vector of the first substrate 110 after assembling two substrates. Similarly, in the second mark region MR2, the shielding layer 130 may selectively include a plurality of second alignment structures 134 (shown in FIG. 4B), wherein each of the second alignment structures 134 may respectively overlap at least a portion of one of the second alignment parts 124a in the normal vector of the first substrate 110 after assembling two substrates. In this embodiment, the shielding layer 130 has a hollow OP, and the first alignment structures 132 protrude in the hollow OP, such that a shape of the hollow OP is similar to battlements, but the present invention is not limited thereto. In order to explain easily, a shape of at least one of the first alignment structures 132 and a shape of at least one of the second alignment structures 134 of this embodiment are for example rectangular, two sides of each of the first alignment structures 132 parallel to the first direction D1 are defined as third sides 132s, and two sides of each of the second alignment structures 134 parallel to the second direction D2 are defined as fourth sides 134s, but the present invention is not limited thereto. In another embodiment, the alignment structure may be designed as other suitable shape, and the third sides 132s and the fourth sides 134s may be curved sides, but the shape of one of the alignment structures need to be similar to the shape of the alignment part correspondingly overlapping the one of the alignment structures. Moreover, in this embodiment, because a width of each of the first alignment structures 132 may be larger than the width of each of the first alignment parts 122a, and a width of each of the second alignment structures 134 may be larger than the width of each of the second alignment parts 124a, a distance between the third sides 132s of each of the first alignment structures 132 may be larger than a distance between the first sides 122s of each of the first alignment parts 122a, and a distance between the fourth sides 134s of each of the second alignment structures 134 may be larger than a distance between the second sides 124s of each of the second alignment parts 124a, but the present invention is not limited thereto. In another embodiment, the width of each of the first alignment structures 132 may be less than or equal to the width of each of the first alignment parts 122a, and the width of each of the second alignment structures 134 may be less than or equal to the width of each of the second alignment parts 124a. On the other hand, a first shielding interval DB1 exists between two adjacent first alignment structures 132, and a second shielding interval DB2 exists between two adjacent second alignment structures 134. In this embodiment, the first shielding intervals DB1 and the second shielding intervals DB2 may be the same as each other, but the present invention is not limited thereto. In another embodiment, at least two of the first shielding intervals DB1 may be different, at least two of the second shielding intervals DB2 may be different, and the first shielding intervals DB1 may be different from the second shielding intervals DB2. Note that the first metal intervals DM1 between the first alignment parts 122a may be different from the first shielding intervals DB1 between the first alignment structures 132, and at least two of the second metal intervals DM2 between the second alignment parts 124a may be different from the second shielding intervals DB2 between the second alignment structures 134. In this embodiment, each of the first metal intervals DM1 is larger than each of the first shielding intervals DB1, and each of the second metal intervals DM2 is larger than each of the second shielding intervals DB2. Also, a distance between two centers of two adjacent first alignment parts 122a of the first alignment parts 122a is larger than a distance between two centers of two adjacent first alignment structures 132 of the first alignment structures 132, and a distance between two centers of two adjacent second alignment parts 124a of the second alignment parts 124a is larger than a distance between two centers of two adjacent second alignment structures 134 of the second alignment structures 134, but the present invention is not limited thereto. In another embodiment, the first metal intervals DM1 may be equal to the first shielding intervals DB1, the second metal intervals DM2 may be equal to the second shielding intervals DB2, the distance between two centers of two adjacent first alignment parts 122a of the first alignment parts 122a is different from the distance between two centers of two adjacent first alignment structures 132 of the first alignment structures 132, and the distance between two centers of two adjacent second alignment parts 124a of the second alignment parts 124a is different from the distance between two centers of two adjacent second alignment structures 134 of the second alignment structures 134.

Figure 5:
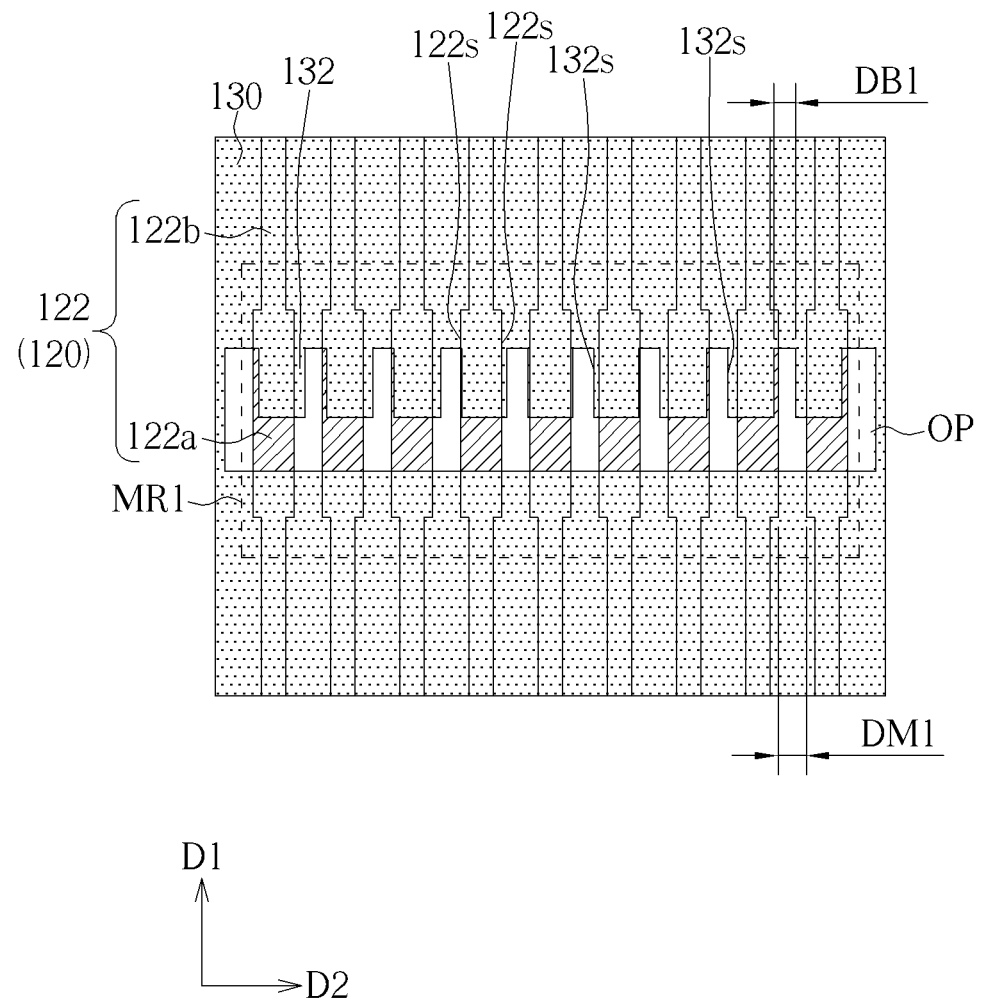
FIG. 5 is a top-view schematic diagram illustrating an overlap of the first metal line segments and the first alignment structures of the shielding layer of the first embodiment of the present invention.

Referring to FIG. 5, FIG. 5 is a top-view schematic diagram illustrating an overlap of the first metal line segments and the first alignment structures of the shielding layer of the first embodiment of the present invention, in which FIG. 5 is the overlap of FIG. 3A and FIG. 4A. As shown in FIG. 5, after assembling the first substrate 110 and the second substrate 140, each of the first alignment structures 132 in the first mark region MR1 may overlap at least a portion of one of the first alignment parts 122a in the normal vector of the first substrate 110, such that each of the first alignment parts 122a and a corresponding one of the first alignment structures 132 may form a group, and at least one of the first metal intervals DM1 between the first alignment parts 122a is different from at least one of the first shielding intervals DB1 between the first alignment structures 132. for example, since each of the first metal intervals DM1 between the first alignment parts 122a is different from each of the first shielding intervals DB1 between the first alignment structures 132, and each of the first metal intervals DM1 is larger than each of the first shielding intervals DB1, the overlap areas and the overlap positions of the groups (each of which is formed of the overlap between the first alignment structure 132 and the corresponding first alignment part 122a) may not be totally equal, wherein one of the first alignment parts 122a is aligned with a corresponding one of the first alignment structures 132 in the normal vector of the first substrate 110 (that is, the direction perpendicular to the surface of the first substrate 110). Note that "the alignment part of the metal wires 120 is aligned with the alignment structure of the shielding layer 130" described herein means that the two particular sides of the alignment part are situated between the two particular sides of the alignment structure. For example, the two first sides 122s of the first alignment part 122a located at the center of FIG. 5 are situated between the two third sides 132s of the first alignment structure 132 located at the center of FIG. 5; that is to say, the first alignment part 122a located at the center of FIG. 5 is aligned with the first alignment structure 132 located at the center of FIG. 5. Because the distance between two centers of two adjacent first alignment parts 122a is larger than the distance between two centers of two adjacent first alignment structures 132, each of the first alignment parts 122a as shown on the left part of FIG. 5 has an offset relative to the corresponding first alignment structure 132 in an opposite direction to the second direction D2, and each of the first alignment parts 122a as shown on the right part of FIG. 5 has an offset relative to the corresponding first alignment structure 132 in the second direction D2, such that one of the first sides 122s of the first alignment parts 122a is not situated between the two third sides 132s of the corresponding first alignment structure 132, but the present invention is not limited thereto. Similarly, after assembling the first substrate 110 and the second substrate 140, each of the second alignment structures 134 in the second mark region MR2 may overlap at least a portion of one of the second alignment parts 124a in the normal vector of the first substrate 110, such that each of the second alignment parts 124a and a corresponding one of the second alignment structures 134 may form a group. One of the second alignment parts 124a is aligned with one of the second alignment structures 134 in the normal vector of the first substrate 110, wherein the determining method of the alignment between the second alignment part 124a and the corresponding second alignment structure 134 is that the two second sides 124s of the second alignment part 124a are situated between the two fourth sides 134s of the corresponding second alignment structure 134, and the other second alignment parts 124a which is not aligned with the corresponding second alignment structure 134 may have an offset relative to the corresponding second alignment structure 134 in the first direction D1 or in an opposite direction to the first direction D1. In another embodiment, if the width of each of the first alignment structures 132 is less than the width of each of the first alignment parts 122a, when one of the first alignment structures 132 is aligned with one of the first alignment parts 122a, the two third sides 132s of the one of the first alignment structures 132 are situated between the two first sides 122s of the corresponding first alignment part 122a; if the width of each of the second alignment structures 134 is less than the width of each of the second alignment parts 124a, when one of the second alignment structures 134 is aligned with one of the second alignment parts 124a, the two fourth sides 134s of the one of the second alignment structures 134 are situated between the two second sides 124s of the corresponding second alignment part 124a.

In the following, the first mark region MR1 shown in FIG. 5 is an example for explaining the application of the present invention. When the first alignment part 122a and the first alignment structure 132 located at the center of the first mark region MR1 (which are the fifth first alignment part 122a and the fifth first alignment structure 132 counted from the left side to the right side of FIG. 5) are aligned with each other, no assembly misalignment in the second direction D2 exists between the first substrate 110 and the second substrate 140, or a little assembly misalignment in the second direction D2 exists between the first substrate 110 and the second substrate 140. Because the distance between two centers of two adjacent first alignment parts 122a is larger than the distance between two centers of two adjacent first alignment structures 132, if the first alignment part 122a and the corresponding first alignment structure 132 of another group different from the group formed by the fifth first alignment part 122a and the fifth first alignment structure 132 (which are not located at center of the first mark region MR1) are aligned with each other, a larger assembly misalignment in the second direction D2 exists between the first substrate 110 and the second substrate 140. Thus, the groups can correspond to different assembly misalignments respectively, when the first alignment part 122a and the corresponding first alignment structure 132 in one of the groups are aligned with each other, different assembly misalignments in the second direction D2 exist between the first substrate 110 and the second substrate 140. For instance, if a difference between the distance between two centers of two adjacent first alignment parts 122a and the distance between two centers of two adjacent first alignment structures 132 is 0.5 µm, the assembly misalignments corresponding to the groups counted from the left side to the right side of FIG. 5 may be −2 µm, −1.5 µm, −1 µm, −0.5 µm, 0 µm, 0.5 µm, 1 µm, 1.5 µm and 2 µm respectively. That is to say, if the first alignment part 122a and the first alignment structure 132 in the third group counted from left to right in FIG. 5 are aligned with each other, the assembly misalignment in the second direction D2 existing between the first substrate 110 and the second substrate 140 is −1 µm, but the present invention is not limited thereto, the design may be adjusted according to requirements. On the other hand, if the first alignment parts 122a and the corresponding first alignment structures 132 in two of the groups are aligned with each other, the assembly misalignment in the second direction D2 existing between two substrates is between the assembly misalignment values corresponding to the two groups. E.g. if the first alignment part 122a and the first alignment structure 132 in the sixth group counted from the left side to the right side of FIG. 5 are aligned with each other and the first alignment part 122a and the first alignment structure 132 in the seventh group counted from the left side to the right side of FIG. 5 are aligned with each other, the assembly misalignment may range from 0.5 µm to 1 µm. Thus, the first alignment parts 122a of the first metal line segments 122 and the first alignment structures 132 of the shielding layer 130 in the first mark region MR1 can be configured to determine the assembly misalignment in the second direction D2 existing between the first substrate 110 and the second substrate 140, so as to be a scale for determining the assembly misalignment in the second direction D2 existing between two substrates. In addition, when confirming which first alignment part 122a is aligned with the corresponding first alignment structure 132, a light may be projected toward the inside of the electronic device 100 from the outside of the first substrate 110 or the outside of the second substrate 140, such that the first alignment parts 122a of the first metal line segments 122 may reflect the light, and a viewer can see which first alignment part 122a is aligned with the corresponding first alignment structure 132 through optical tools. For instance, the viewer confirms whether the two first sides 122s of one of the first alignment parts 122a are situated between the two third sides 132s of one of the first alignment structures 132 by seeing the hollow OP under the first alignment structure 132 in FIG. 5, but the present invention is not limited thereto. In order to find the first alignment parts 122a in the first mark region MR1 easily and see the alignment of the first alignment part 122a and the corresponding first alignment structure 132 easily, a width of at least one of the metal wires 120 may be larger than 4 µm, or range from 10 µm to 20 µm, and a difference between the width of at least one of the first alignment parts 122a and the width of at least one of the first trace parts 122b is larger than or equal to 1 µm. For example, a width of each of the metal wires 120 may be larger than 4 µm, or range from 10 µm to 20 µm, and a difference between the width of each of the first alignment parts 122a and the width of each of the first trace parts 122b is larger than or equal to 1 µm; for example, the first alignment part 122a protrudes at least 0.5 µm from two sides of the first trace parts 122b in the second direction D2 in FIG. 3A and FIG. 5, but the present invention is not limited thereto. Note that the width described above is a size perpendicular to a direction which the metal wire 120 extends along; e.g. the first metal line segments 122 extend along the first direction D1, so the width of the first metal line segments 122 is a size along the second direction D2. The assembly misalignment in the second direction D2 that existing between the first substrate 110 and the second substrate 140 may be confirmed by seeing the alignment of which group, so as to determine whether the assembly of the electronic device is correct according to an allowable deviation range. Similarly, the second alignment parts 124a of the second metal line segments 124 and the second alignment structures 134 of the shielding layer 130 in the second mark region MR2 are configured to determine the assembly misalignment in the first direction D1 that existing between the first substrate 110 and the second substrate 140, so as to be a scale for determining the assembly misalignment in the first direction D1 existing between two substrates. The application of the second mark region MR2 is similar to the first mark region MR1, and will not be redundantly described.

In this embodiment, since the first alignment parts 122a and the second alignment parts 124a configured to determine the assembly misalignment existing between two substrates are combined with the metal wires 120 situated within the peripheral region PR, it does not need to increase extra space for disposing the scale for alignment in the peripheral region PR. Therefore, as compared with a conventional electronic device, the area of the peripheral region PR may be reduced, which shrinks borders of the electronic device 100.

Moreover, in this embodiment, the electronic device 100 may further include a sealant 150 disposed between the first substrate 110 and the second substrate 140, and the sealant is configured to adhere the first substrate 110 and the second substrate 140 for assembly. The sealant 150 may overlap at least a portion of the first alignment structures 132 and at least a portion of the second alignment structures 134 of the shielding layer 130 in the normal vector of the first substrate 110, and the sealant 150 may also overlap at least a portion of the first alignment parts 122a and at least a portion of the second alignment parts 124a in the normal vector of the first substrate 110. The sealant 150 of this embodiment may be a transparent sealant. Furthermore, the electronic device 100 may further include an outer frame disposed outside the first substrate 110 and the second substrate 140 for protecting the inner structures of the electronic device 100. Because the hollow OP of the shielding layer 130 is disposed at the surrounding of the first alignment structures 132 and the surrounding of the second alignment structures 134, the outer frame may shield the hollow OP of the shielding layer 130 adjacent to the first alignment structures 132 and the second alignment structures 134 for preventing the electronic device 100 from light leakage and influencing usage quality.

The electronic device of the present invention is not limited to the above embodiments. Further embodiments or modifications of the present invention are described below. For ease of comparison, the same components will be labeled with the same symbol in the following description. The following description only details the differences between the embodiments, and same parts will not be redundantly described.

Figure 6A:
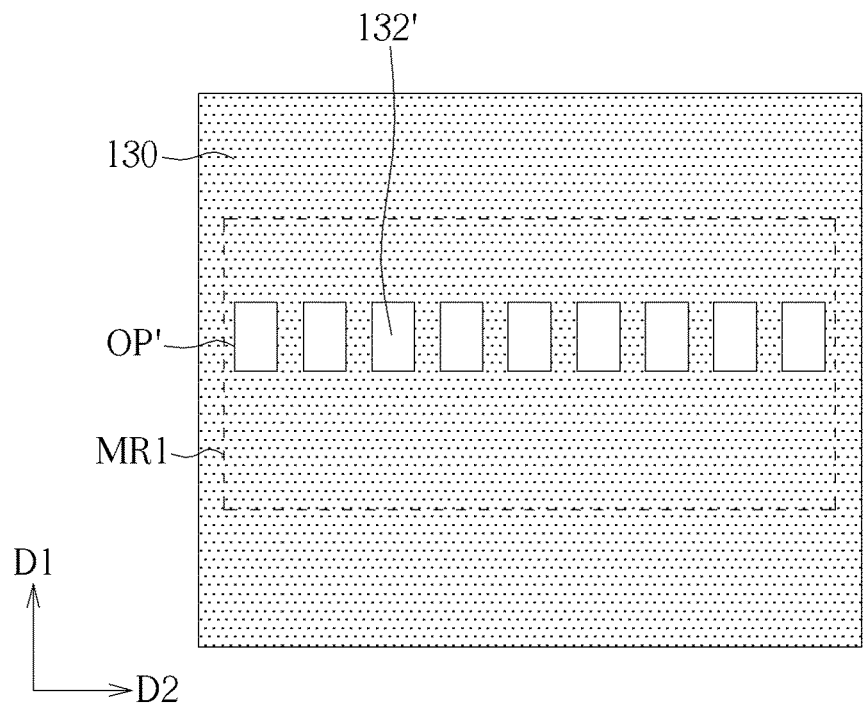
FIG. 6A is a top-view schematic diagram illustrating the first alignment structures of the shielding layer of a variant embodiment of the first embodiment of the present invention.
Figure 6B:
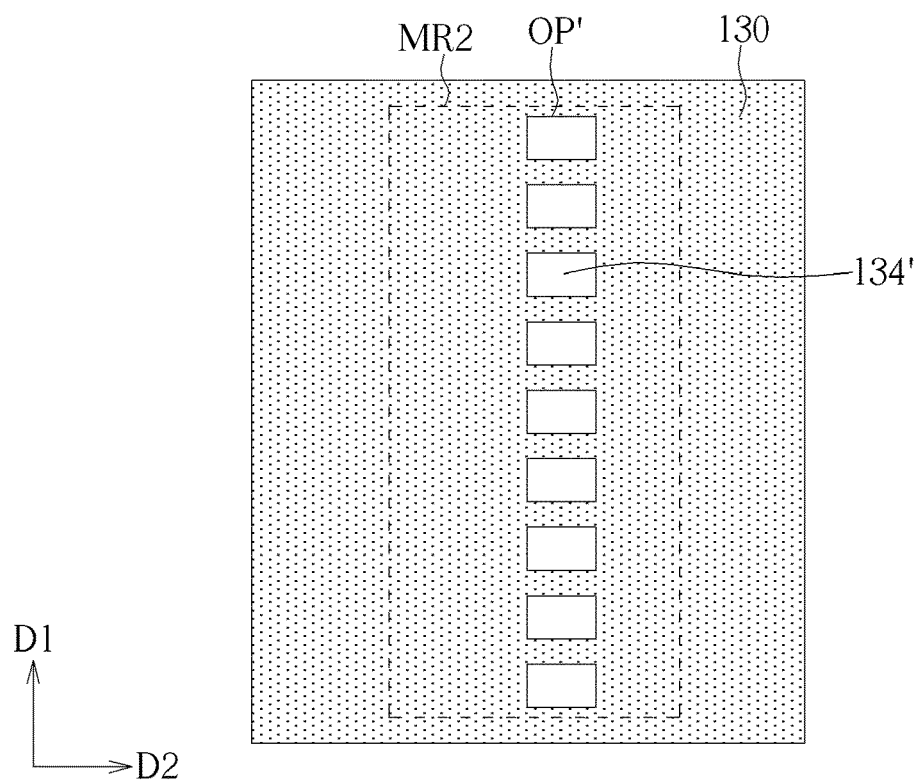
FIG. 6B is a top-view schematic diagram illustrating the second alignment structures of the shielding layer of the variant embodiment of the first embodiment of the present invention.

Referring to FIG. 6A and FIG. 6B, FIG. 6A is a top-view schematic diagram illustrating the first alignment structures of the shielding layer of a variant embodiment of the first embodiment of the present invention, and FIG. 6B is a top-view schematic diagram illustrating the second alignment structures of the shielding layer of the variant embodiment of the first embodiment of the present invention. As shown in FIG. 6A and FIG. 6B, the design of the first alignment structures 132' and the second alignment structures 134' of the shielding layer 130 of the electronic device of this variant embodiment is different from that of the first embodiment. In this variant embodiment, the shielding layer 130 may have a plurality of openings OP', and each of the first alignment structures 132' (shown in FIG. 6A) and each of the second alignment structures 134' (shown in FIG. 6B) may include one of the openings OP'. For example, each of the first alignment structures 132' and each of the second alignment structures 134' is formed of one of the openings OP' of the shielding layer 130, but the present invention is not limited thereto. In another variant embodiment, each of the first alignment structures 132' and each of the second alignment structures 134' may include a portion of one of the openings OP'. In this variant embodiment, the width of the first alignment structures 132' is larger than the width of the first alignment parts 122a, and the width of the second alignment structures 134' is larger than the width of the second alignment parts 124a; that is, a width of each of the openings OP' is larger than the width of each of the first alignment parts 122a and larger than the width of each of the second alignment parts 124a, but the present invention is not limited thereto. When determining the assembly misalignment, the viewer may see whether the two first sides 122s of one of the first alignment parts 122a are situated within the opening OP' of the corresponding first alignment structure 132', so as to determine which first alignment part 122a is aligned with the corresponding first alignment structure 132'. Furthermore, the viewer may see whether the two second sides 124s of one of the second alignment parts 124a are situated within the opening OP' of the corresponding second alignment structure 134', so as to determine which second alignment part 124a is aligned with the corresponding second alignment structure 134', but the determining method is not limited thereto.

Figure 7:
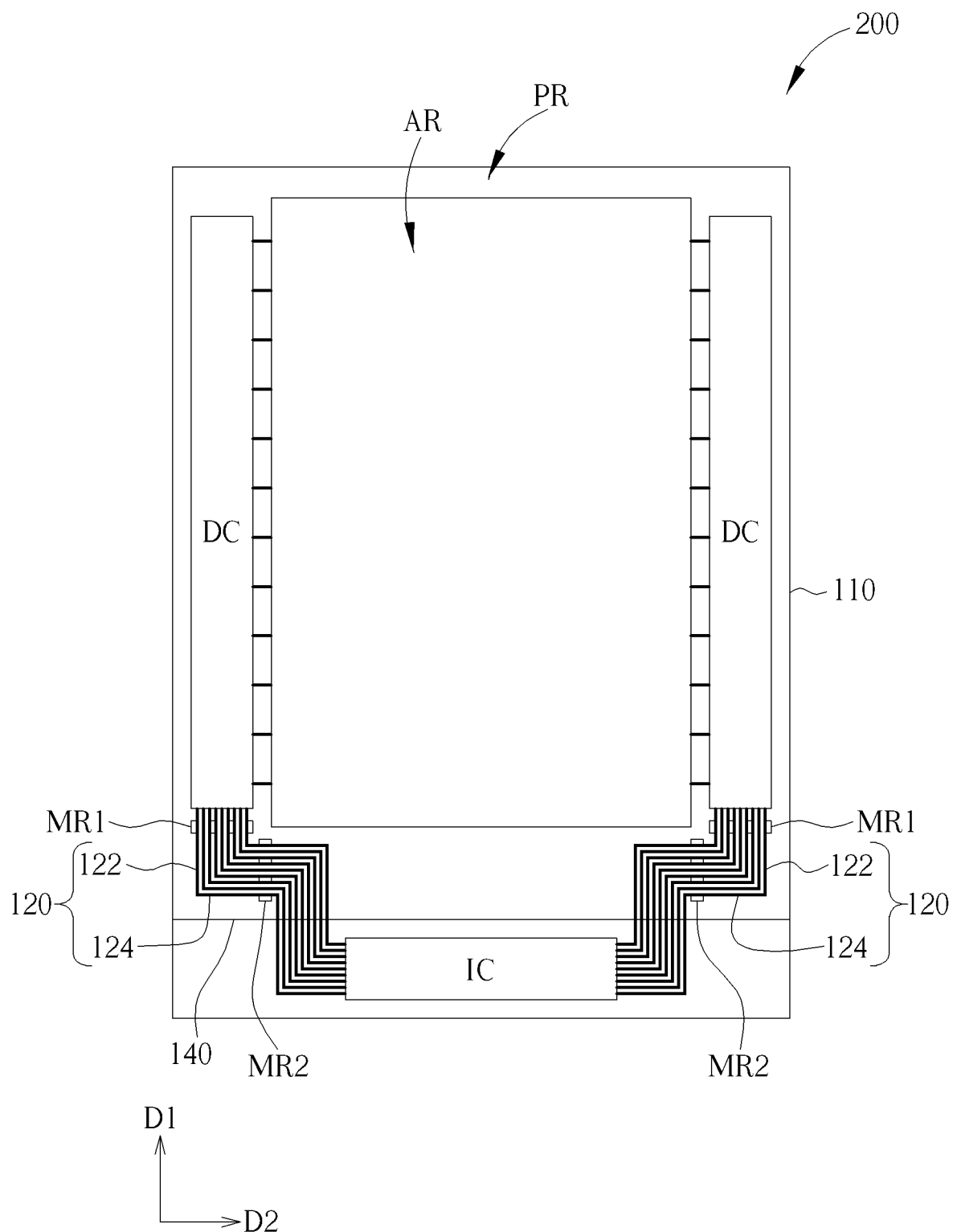
FIG. 7 is a top-view schematic diagram illustrating the electronic device of a second embodiment of the present invention.
Figure 8:
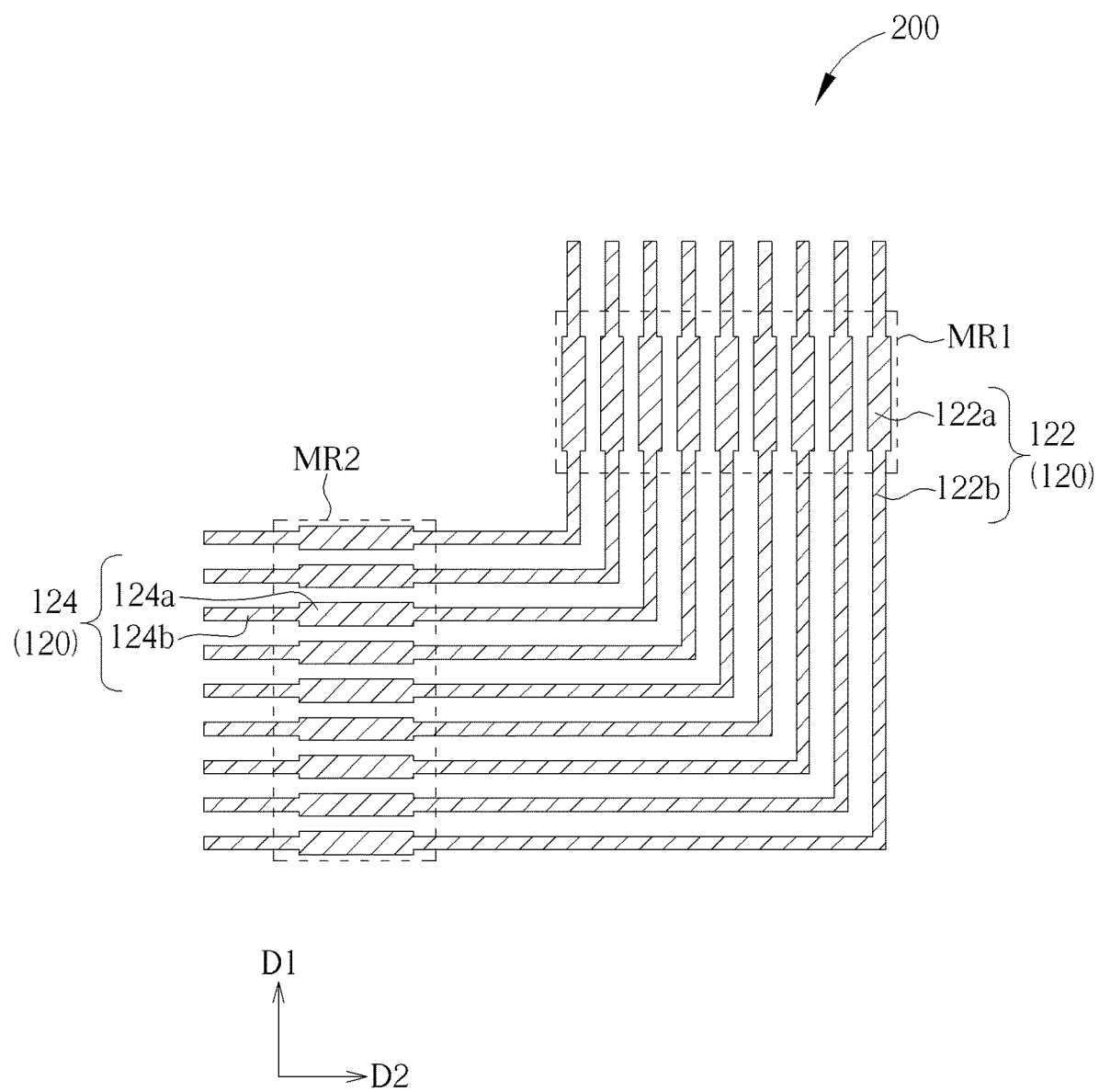
FIG. 8 is a top-view schematic diagram illustrating the first metal line segments and the second metal line segments of the second embodiment of the present invention.

Referring to FIG. 7 and FIG. 8, FIG. 7 is a top-view schematic diagram illustrating the electronic device of a second embodiment of the present invention, and FIG. 8 is a top-view schematic diagram illustrating the first metal line segments and the second metal line segments of the second embodiment of the present invention, in which FIG. 8 illustrates the metal wires 120 shown at the lower right of FIG. 7. As shown in FIG. 7 and FIG. 8, the difference between this embodiment and the first embodiment is that the first mark region MR1 and the second mark region MR2 of the electronic device 200 of this embodiment may correspond to a same corner of the second substrate 140, and thus, the first alignment parts 122a and the second alignment parts 124a may correspond to the same corner of the second substrate 140, and may be adjacent to a same side of the first substrate 110. The first alignment structures corresponds to one of the first alignment parts 122a, and the second alignment structures corresponds to one of the second alignment parts 124a. In this embodiment, the electronic device 200 may have one first mark region MR1 and one second mark region MR2 adjacent to one side of the electronic device 200 and another first mark region MR1 and another second mark region MR2 adjacent to another side of the electronic device 200, but the present invention is not limited thereto. In another embodiment, the electronic device 200 may have only one first mark region MR1 and only one second mark region MR2 adjacent to one side of the electronic device 200. In addition, in this embodiment, one of the first metal line segments 122 and one of the second metal line segments 124 may be included in the same metal wire 120; in other words, one of the metal wires 120 may include one of the first metal line segments 122 extending along the first direction D1 and one of the second metal line segments 124 extending along the second direction D2. Therefore, one of the metal wires 120 may include one of the first alignment parts 122a, one of the first trace parts 122b, one of the second alignment parts 124a and one of the second trace parts 124b, as shown in FIG. 8.

Figure 9:
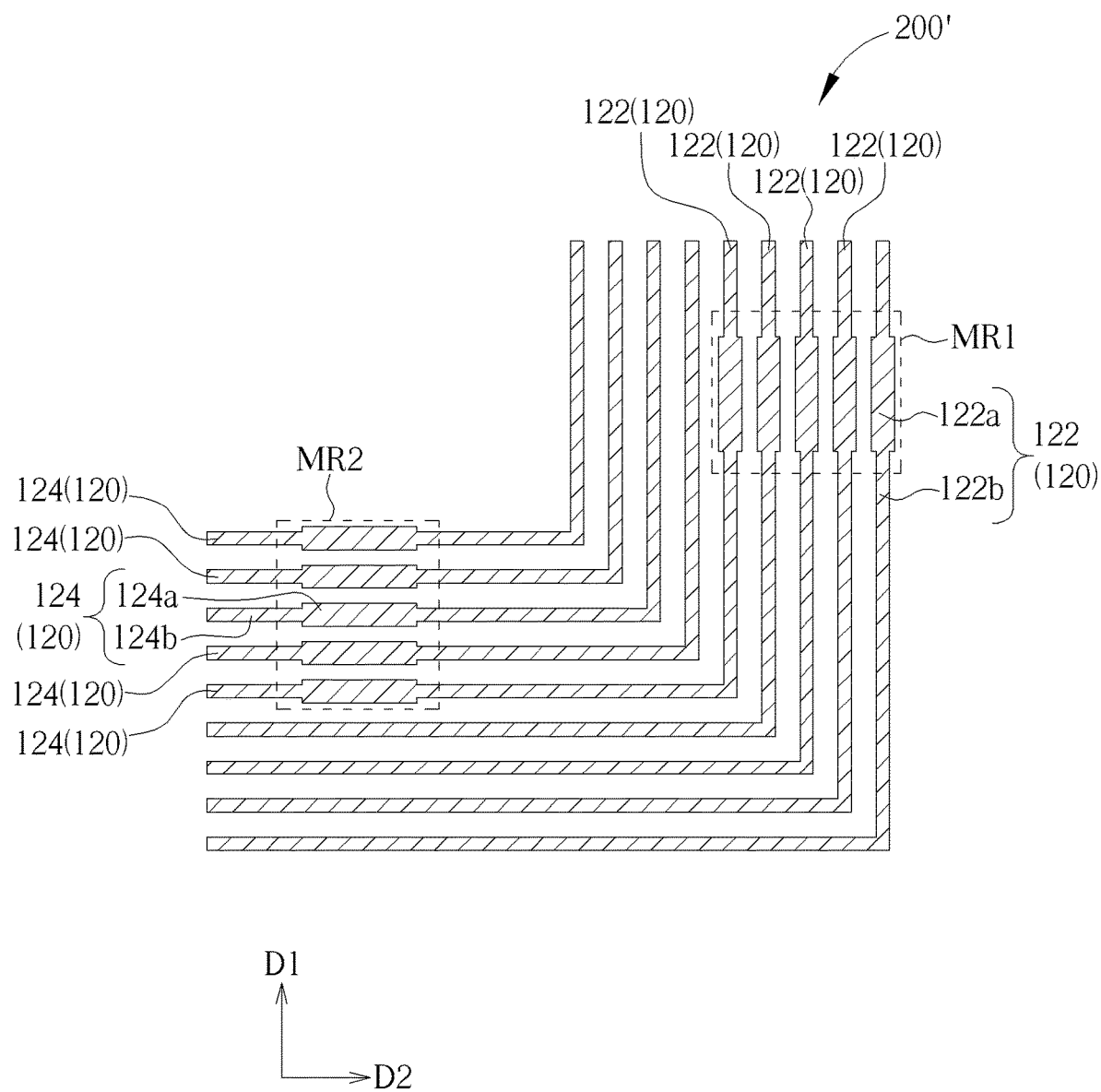
FIG. 9 is a top-view schematic diagram illustrating the first metal line segments and the second metal line segments of a variant embodiment of the second embodiment of the present invention.

Referring to FIG. 9, FIG. 9 is a top-view schematic diagram illustrating the first metal line segments and the second metal line segments of a variant embodiment of the second embodiment of the present invention. As shown in FIG. 9, the difference between this variant embodiment and the second embodiment is that at least one of the metal wires 120 of the electronic device 200' of this variant embodiment includes one of the first metal line segment 122 and the second metal line segment 124, and at least another one of the metal wires 120 includes the first metal line segment 122 and the second metal line segment 124, but the first mark region MR1 and the second mark region MR2 may correspond the same corner of the second substrate 140. For instance, in FIG. 9, each of the first to fourth metal wires 120 counted from upper left to the lower right includes the second metal line segment 124 (that is, includes the second alignment parts 124a in the second mark region MR2), each of the sixth to ninth metal wires 120 counted from upper left to the lower right includes the first metal line segment 122 (that is, includes the first alignment parts 122a in the first mark region MR1), and the fifth metal wire 120 counted from upper left to the lower right includes the first metal line segment 122 and the second metal line segment 124 (that is, includes one of the first alignment parts 122a in the first mark region MR1 and one of the second alignment parts 124a in the second mark region MR2), but the present invention is not limited thereto. In another variant embodiment, each of the metal wires 120 may only include one of the first metal line segment 122 and the second metal line segment 124.

Figure 10:
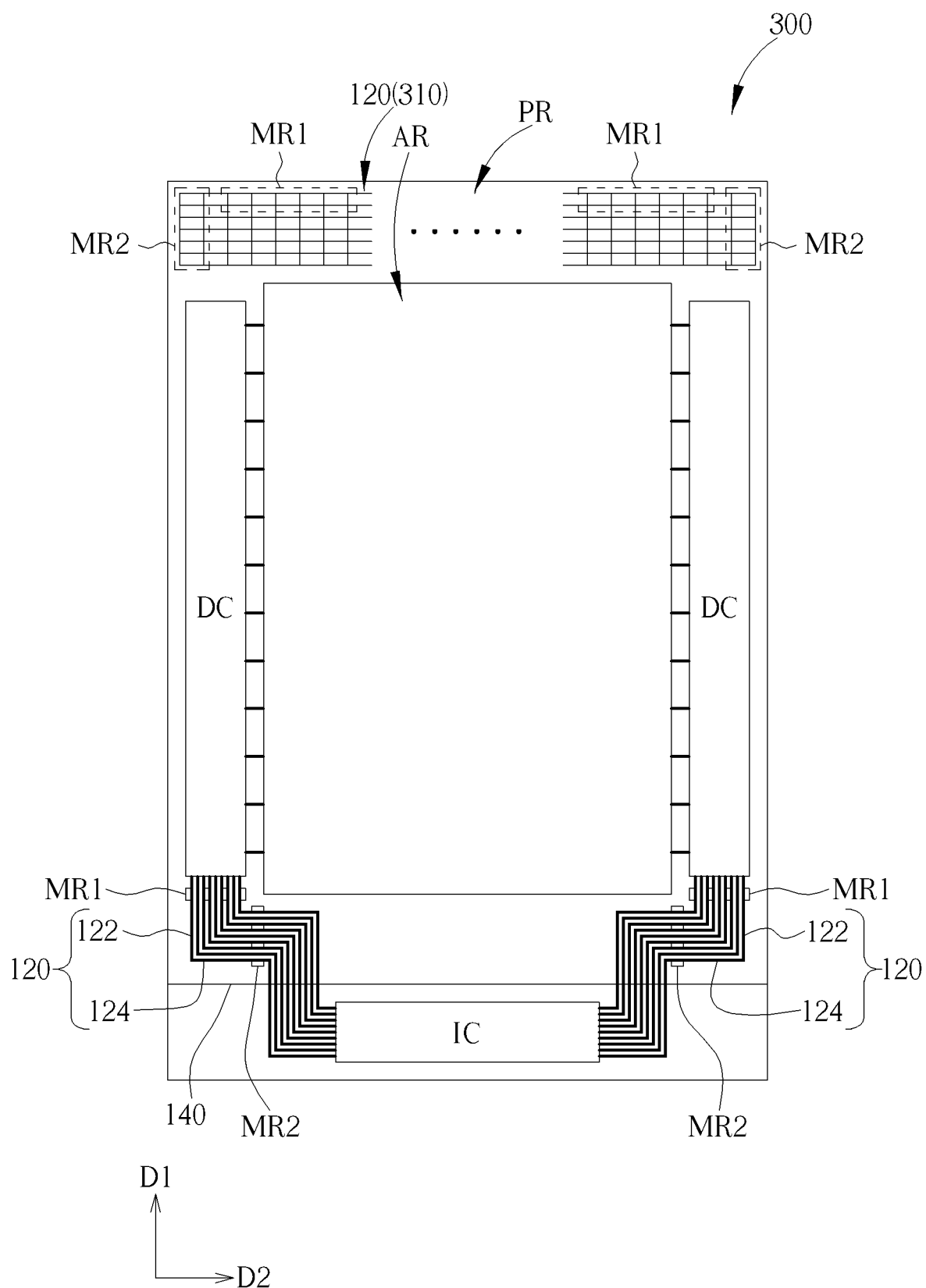
FIG. 10 is a top-view schematic diagram illustrating the electronic device of a third embodiment of the present invention.
Figure 11:
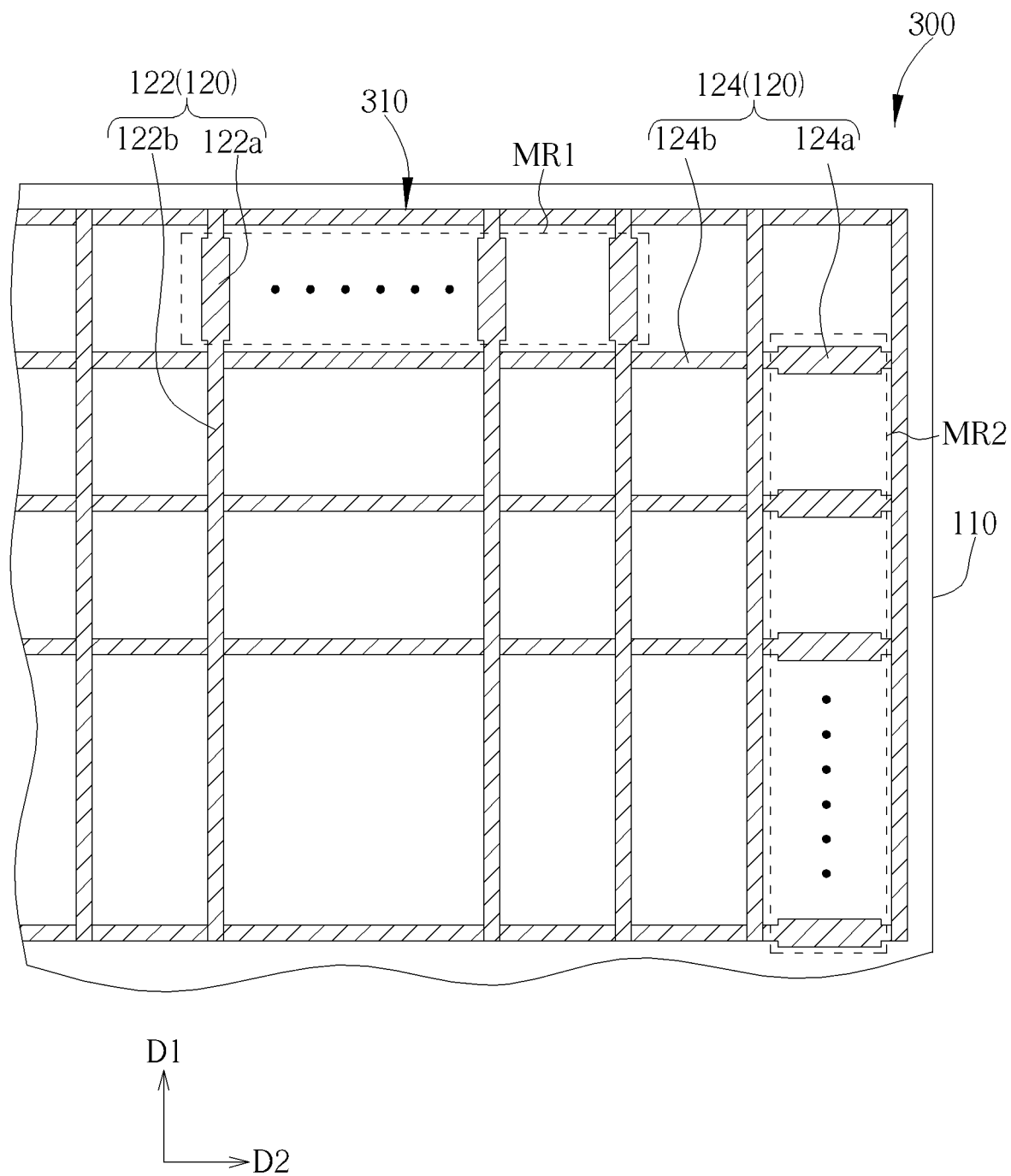
FIG. 11 is a top-view schematic diagram illustrating the first metal line segments and the second metal line segments of the third embodiment of the present invention.

Referring to FIG. 10 and FIG. 11, FIG. 10 is a top-view schematic diagram illustrating the electronic device of a third embodiment of the present invention, and FIG. 11 is a top-view schematic diagram illustrating the first metal line segments and the second metal line segments of the third embodiment of the present invention, wherein FIG. 11 illustrates the region shown at the upper right of FIG. 10. As shown in FIG. 10 and FIG. 11, the difference between this embodiment and the second embodiment is that the electronic device 300 of this embodiment further includes a metal mesh structure 310 disposed within the peripheral region PR, the metal mesh structure 310 is formed of the metal wires 120 crossing each other, and the metal mesh structure 310 may be for example electrically connected to a common electrode or other circuit. In this embodiment, the metal mesh structure 310 is disposed within the peripheral region PR adjacent at a side of the active region AR (e.g. adjacent at the upper side of the active region AR in FIG. 10), but the present invention is not limited thereto. The first metal line segments 122 and the second metal line segments 124 of this embodiment may be included in the metal mesh structure 310; that is to say, the first metal line segments 122 may cross the second metal line segments 124. In this embodiment, the first mark region MR1 and the second mark region MR2 may correspond to the same corner of the second substrate 140, and each of four corners of the second substrate 140 has the first mark region MR1 and the second mark region MR2, but the present invention is not limited thereto. In another embodiment, each first mark region MR1 included in the electronic device 300 may only have the first metal line segments 122 included in the metal mesh structure 310, each second mark region MR2 included in the electronic device 300 may only have the second metal line segments 124 included in the metal mesh structure 310, and the first mark region MR1 and the second mark region MR2 are disposed adjacent to the same corner or disposed adjacent to different corners. Each corner of the second substrate 140 does not necessarily have the first mark region MR1 and the second mark region MR2, and the dispositions of the first mark region MR1 and the second mark region MR2 may be designed according to requirements. With regards to the first mark region MR1 and the second mark region MR2 defined by the metal mesh structure 310, the first mark region MR1 and the second mark region MR2 are respectively adjacent to the different sides of the first substrate 110; for example, in FIG. 11, the first mark region MR1 is adjacent to the upper side of the first substrate 110, and the second mark region MR2 is adjacent to the right side of the first substrate 110. Therefore, in the metal mesh structure 310, the first alignment parts 122a are adjacent to one side of the first substrate 110, and the second alignment parts 124a are adjacent to another side of the first substrate 110, but the present invention is not limited thereto.

Figure 12:
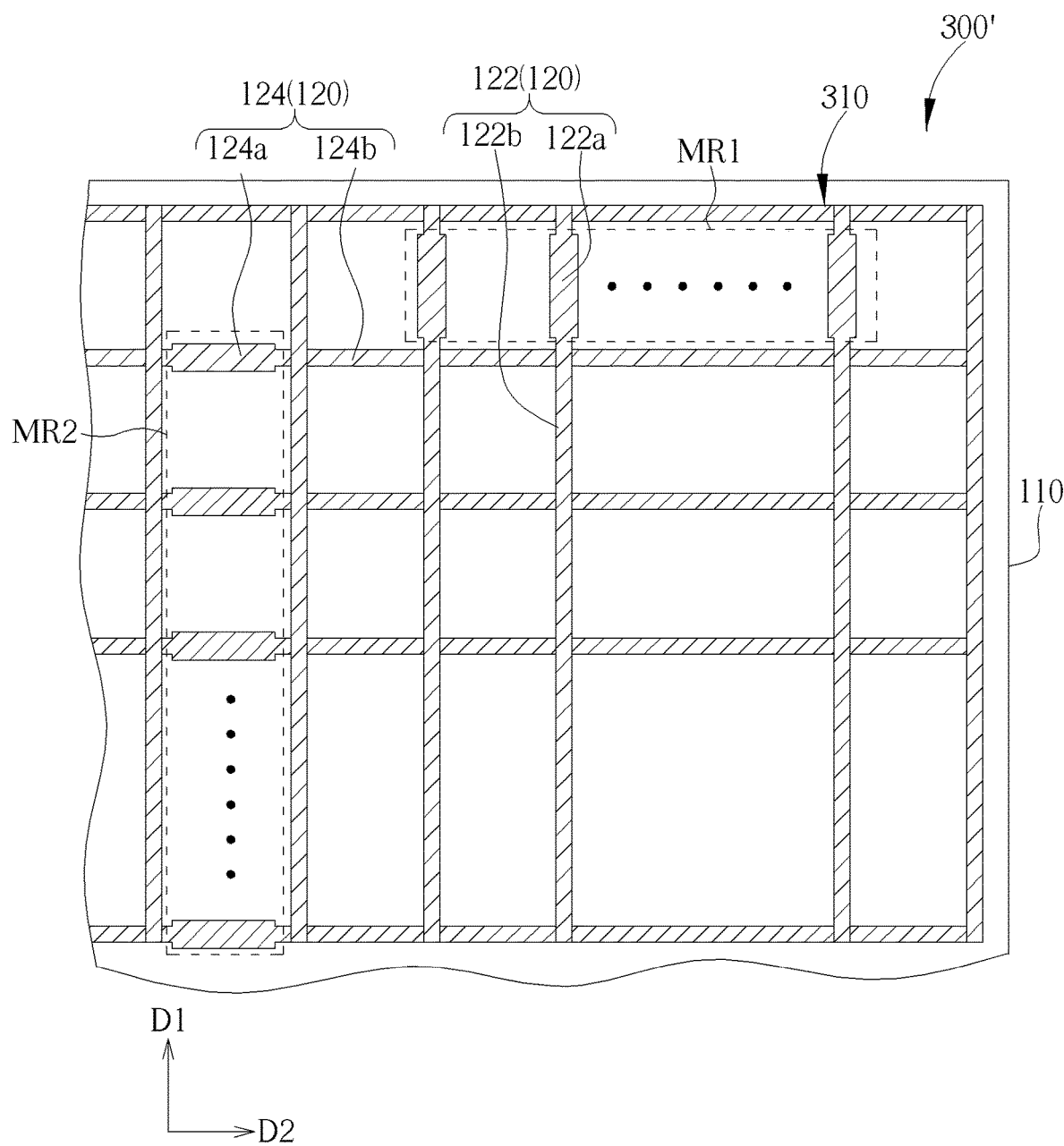
FIG. 12 is a top-view schematic diagram illustrating the first metal line segments and the second metal line segments of a variant embodiment of the third embodiment of the present invention.

Referring to FIG. 12, FIG. 12 is a top-view schematic diagram illustrating the first metal line segments and the second metal line segments of a variant embodiment of the third embodiment of the present invention. As shown in FIG. 12, the difference between this variant embodiment and the third embodiment is that the first mark region MR1 and the second mark region MR2 of the electronic device 300' of this variant embodiment having the metal mesh structure 310 are adjacent to the same side of the first substrate 110. For instance, in FIG. 12, the first mark region MR1 and the second mark region MR2 are adjacent to the upper side of the first substrate 110. Therefore, the first alignment parts 122a and the second alignment parts 124a are adjacent to the same side of the first substrate 110, but the present invention is not limited thereto.

In summary, in the electronic device of the present invention, since the alignment parts configured to determine the assembly misalignment existing between the first substrate and the second substrate is integrated into the metal wires in the peripheral region, and the alignment part is a portion of the metal wire, it does not need to increase extra space for disposing the scale for alignment in the peripheral region. Therefore, as compared with a conventional electronic device, the area of the peripheral region may be reduced, which shrinks the borders of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
a first substrate;
a second substrate opposite to the first substrate;
a plurality of first metal line segments disposed on the first substrate, and the first metal line segments extending along a first direction, wherein at least one of the first metal line segments comprises a first alignment part and a first trace part, a width of the first alignment part is larger than a width of the first trace part, and the first alignment parts are arranged along a second direction different from the first direction; and
a shielding layer disposed on the second substrate, the shielding layer comprising a plurality of first alignment structures,
wherein one of the first alignment parts is aligned with one of the first alignment structures in a normal vector of the first substrate.

2. The electronic device of claim 1, further comprising a plurality of second metal line segments disposed on the first substrate, the second metal line segments extending along the second direction,
wherein at least one of the second metal line segments comprises a second alignment part and a second trace part, a width of the second alignment part is larger than a width of the second trace part, and the second alignment parts are arranged along the first direction,
wherein the shielding layer further comprises a plurality of second alignment structures, one of the second alignment parts is aligned with one of the second alignment structures in the normal vector of the first substrate.

3. The electronic device of claim 2, wherein one of the first metal line segments and one of the second metal line segments are included in a same metal wire.

4. The electronic device of claim 2, wherein the first metal line segments and the second metal line segments are included in different metal wires.

5. The electronic device of claim 2, wherein the first alignment parts and the second alignment parts correspond to a same corner of the second substrate.

6. The electronic device of claim 2, wherein the first alignment parts correspond to a corner of the second substrate, and the second alignment parts correspond to another corner of the second substrate.

7. The electronic device of claim 2, wherein the first alignment parts and the second alignment parts are adjacent to a same side of the first substrate.

8. The electronic device of claim 2, wherein the first alignment parts are adjacent to a side of the first substrate, and the second alignment parts are adjacent to another side of the first substrate.

9. The electronic device of claim 2, wherein the first metal line segments cross the second metal line segments.

10. The electronic device of claim 2, wherein the first direction is perpendicular to the second direction.

11. The electronic device of claim 1, wherein at least one of the first metal line segments is electrically connected to at least one circuit.

12. The electronic device of claim 1, wherein the first alignment structures are adjacent to a side of the second substrate.

13. The electronic device of claim 1, wherein a shape of the first alignment parts and a shape of the first alignment structures are rectangular.

14. The electronic device of claim 1, wherein each of the first alignment structures comprises an opening.

15. The electronic device of claim 14, wherein a width of each of the openings is larger than the width of each of the first alignment parts.

16. The electronic device of claim 1, wherein the shielding layer has a hollow, and the first alignment structures protrude in the hollow.

17. The electronic device of claim 1, wherein a difference between the width of the first alignment part and the width of the first trace part is larger than or equal to 1 µm.

18. The electronic device of claim 1, wherein there is a metal interval between two adjacent first alignment parts, there is a shielding interval existing between two adjacent first alignment structures, and the metal interval is different from the shielding interval.

19. The electronic device of claim 1, wherein a distance between two adjacent first alignment parts is larger than or equal to 2 µm.

20. The electronic device of claim 1, further comprising a sealant disposed between the first substrate and the second substrate, wherein the sealant overlaps at least a portion of the first alignment structures of the shielding layer in the normal vector of the first substrate.

* * * * *